United States Patent [19]
Sohn et al.

[11] Patent Number: 5,579,271
[45] Date of Patent: Nov. 26, 1996

[54] AUTOMATIC TEST CIRCUIT FOR A SEMICONDUCTOR MEMORY DEVICE CAPABLE OF GENERATING INTERNAL RAS AND CAS SIGNALS, AND ROW AND COLUMN ADDRESS SIGNALS

[75] Inventors: Seon I. Sohn; Yong Hwang, both of Kyoungki-do, Rep. of Korea

[73] Assignee: Hyundai Electronics Industries, Co. Ltd., Kyoungki-do, Rep. of Korea

[21] Appl. No.: 554,698

[22] Filed: Nov. 7, 1995

[30] Foreign Application Priority Data

Nov. 9, 1994 [KR] Rep. of Korea .................. 94-29344
Nov. 9, 1994 [KR] Rep. of Korea .................. 94-29345

[51] Int. Cl.$^6$ ................................. G11C 29/00
[52] U.S. Cl. .................... 365/201; 365/193; 365/233; 365/230.08; 365/236
[58] Field of Search ................................. 365/201, 193, 365/233, 230.08, 236

[56] References Cited

U.S. PATENT DOCUMENTS 5,204,837  4/1993  Suwa et al. .................. 365/201

*Primary Examiner*—David C. Nelms
*Assistant Examiner*—Andrew Q. Tran
*Attorney, Agent, or Firm*—Nath & Associates; Gary M. Nath

[57] ABSTRACT

An automatic test circuit for automatically testing the operation of a semiconductor memory device to check whether it is normal or abnormal. The automatic test circuit comprises a test command signal generation stage for generating a test command signal in response to an external row address strobe signal, an external column address strobe signal, an external write signal and an external read signal, a row address signal generation stage for generating an internal row address strobe signal and a row address signal in response to the external row address strobe signal and the test command signal from the test command signal generation stage, and a column address signal generation stage for generating an internal column address strobe signal and a column address signal in response to the internal row address strobe signal from the row address signal generation stage and the test command signal from the test command signal generation stage.

7 Claims, 4 Drawing Sheets

5,579,271

AUTOMATIC TEST CIRCUIT FOR A SEMICONDUCTOR MEMORY DEVICE CAPABLE OF GENERATING INTERNAL RAS AND CAS SIGNALS, AND ROW AND COLUMN ADDRESS SIGNALS

BACKGROUND OF THE INVENTION

1. Field of the Invention

The present invention relates in general to a test circuit for testing the operation of a semiconductor memory device such as a dynamic random access memory (DRAM) to check whether it is normal or abnormal, and more particularly to an automatic test circuit for a semiconductor memory device which is capable of automatically testing the operation of the semiconductor memory device in data write and read modes to check whether it is normal or abnormal.

2. Description of the Prior Art

Generally, in a test mode, a semiconductor memory device receives test addresses directly from the outside to perform data read and write operations. However, a system comprising such a semiconductor memory device must alternately supply a row address strobe signal and a column address strobe signal to the memory device for the data read and write operations thereof in the test mode. As a result, it is very inconvenient to design such a system.

SUMMARY OF THE INVENTION

Therefore, the present invention has been made in view of the above problem, and it is an object of the present invention to provide an automatic test circuit for a semiconductor memory device which is capable of automatically testing the semiconductor memory device in response to internal row and column address strobe signals and the associated signals in the memory device when the memory device enters a test mode in response to one external test command and then performs data read and write operations, thereby enhancing the test speed and simplifying the layout of a system comprising the memory device.

In accordance with one aspect of the present invention, there is provided an automatic test circuit for a semiconductor memory device comprising test command signal generation means for generating a test command signal in response to an external row address strobe signal, an external column address strobe signal, an external write signal and an external read signal; row address signal generation means for generating an internal row address strobe signal and a row address signal in response to the external row address strobe signal and the test command signal from the test command signal generation means; and column address signal generation means for generating an internal column address strobe signal and a column address signal in response to the internal row address strobe signal from the row address signal generation means and the test command signal from the test command signal generation means.

In accordance with another aspect of the present invention, there is provided an automatic test circuit for a semiconductor memory device comprising control signal input means for receiving an external row address strobe signal after power applied to the semiconductor memory device is stabilized and generating a timing signal in response to the received external row address strobe signal; test command signal generation means for generating a test command signal in response to an external memory device power stabilized signal and an output signal from the control signal input means; row address signal generation means for generating an internal row address strobe signal and a row address signal in response to the test command signal from the test command signal generation means; and column address signal generation means for generating an internal column address strobe signal and a column address signal in response to the internal row address strobe signal from the row address signal generation means.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 1:
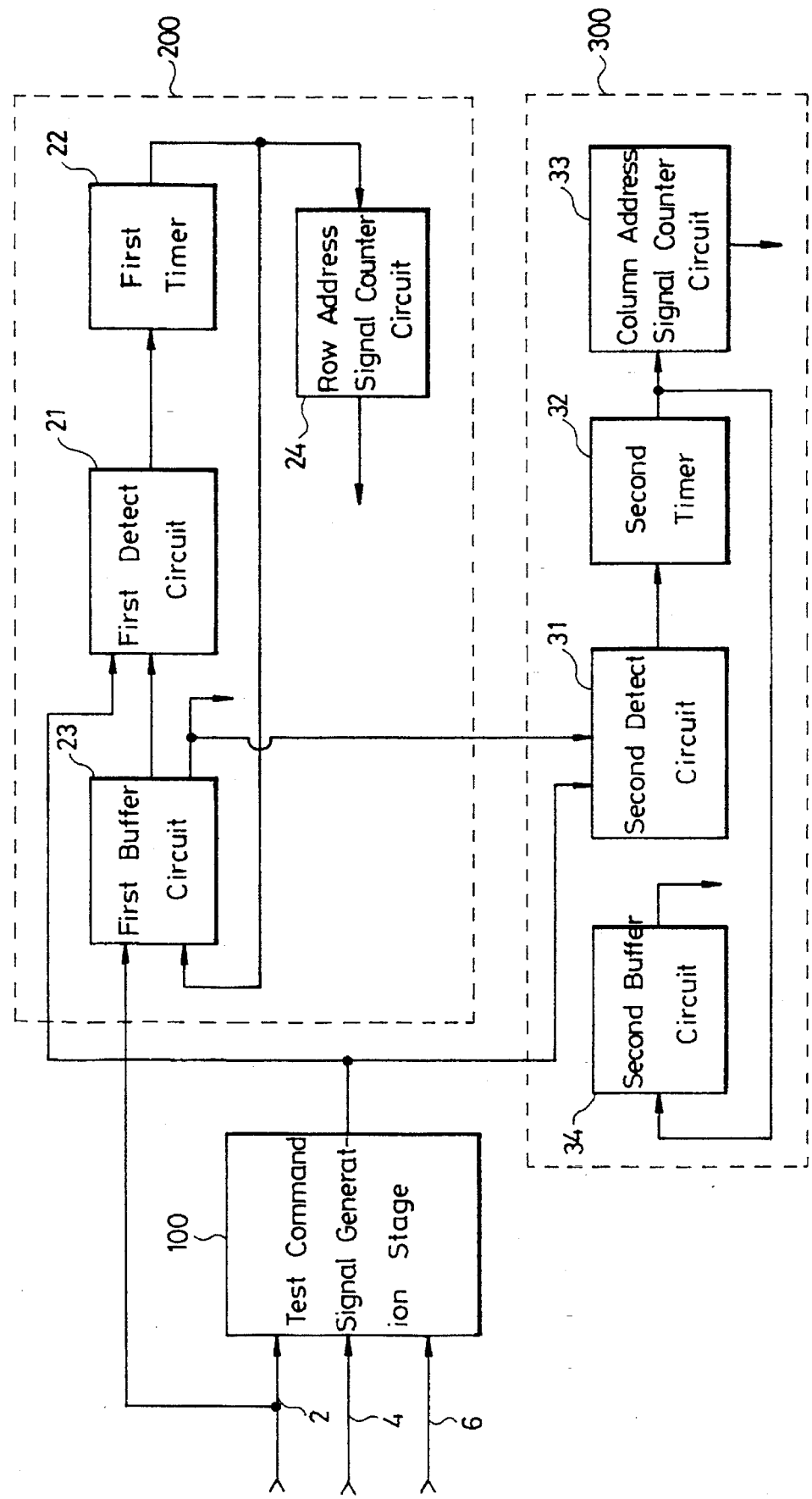
FIG. 1 is a block diagram of an automatic test circuit for a semiconductor memory device in accordance with an embodiment of the present invention.

Referring to FIG. 1, there is shown a block diagram of an automatic test circuit for a semiconductor memory device in accordance with an embodiment of the present invention. As shown in this drawing, the automatic test circuit comprises a test command signal generation stage 100 for generating a test command signal in response to an external row address strobe signal, an external column address strobe signal, an external write signal and an external read signal, a row address signal generation stage 200 for generating an internal row address strobe signal and a row address signal in response to the ecternal row address strobe signal and the test command signal from the test command signal generation stage 100, and a column address signal generation stage 300 for generating an internal column address strobe signal and a column address signal in response to the test command signal from the test command signal generation stage 100 and the internal row address strobe signal from the row address signal generation stage 200.

The test command signal generation stage 100 includes a first input line 2 for inputting the external row address strobe signal, a second input line 4 for inputting the external column address strobe signal, and a third input line 6 for inputting the external write and read signals. The test command signal generation stage 100 generates the test command signal in response to the external row and column address strobe signals and the external write and read signals. The test command signal generation stage 100 then supplies the generated test command signal to the row address signal generation stage 200 and the column address signal generation stage 300.

The row address signal generation stage 200 includes a first detector circuit 21 for detecting the test command signal from the test command signal generation stage 100 and the external row address strobe signal, a first timer 22 for generating a clock signal with a first predetermined period in response to an output signal from the first detector circuit 21, a row address signal counter circuit 24 for generating the row address signal in response to the clock signal from the first timer 22, and a first buffer circuit 23 for buffering the external row address strobe signal and supplying the buffered external row address strobe signal to the first detector circuit 21. The first buffer circuit 23 also buffers the clock signal from the first timer 22 and supplies the buffered clock signal as the internal row address strobe signal to the column address signal generation stage 300. Preferably, the first predetermined period of the clock signal from the first timer 22 may be 16 μs. Also, the row address signal from the row address signal counter circuit 24 may be a 13-bit signal.

Upon receiving the test command signal from the test command signal generation stage 100, the first detector circuit 21 resets the first timer 22 to the initial state in response to the buffered external row address strobe signal from the first buffer circuit 23.

The first timer 22 generates the clock signal with the first predetermined period in response to the output signal from the first detector circuit 21. The first timer 22 then supplies the generated clock signal to the first buffer circuit 23 and the row address signal counter circuit 24.

Preferably, the row address signal counter circuit 24 may be of the asynchronous type. The row address signal counter circuit 24 may also include bit counters of the same number (for example, 13) as that of bits of the row address signal.

The bit counters may be of the conventional type and each of them has an output line connected to an input line of the subsequent bit counter. The first bit counter provides a bit output of a period (for example, 32 μs) twice that of the clock signal from the first timer 22. The second bit counter provides a bit output of a period (for example, 64 μs) twice that of the bit output from the first bit counter. In this manner, each of the bit counters outputs a signal of a period twice that of an output signal from the preceding bit counter.

The bit counters then supply the row address signal bits through their output lines to a row address decoder (not shown).

The first buffer circuit 23 buffers the clock signal from the first timer 22 and supplies the buffered clock signal as the internal row address strobe signal to the column address signal generation stage 300.

The column address signal generation stage 300 includes a second detector circuit 31 for detecting the test command signal from the test command signal generation stage 100 and the internal row address strobe signal from the first buffer circuit 23 in the row address signal generation stage 200, a second timer 32 for generating a clock signal with a second predetermined period in response to an output signal from the second detector circuit 31, a column address signal counter circuit 33 for generating the column address signal in response to the clock signal from the second timer 32, and a second buffer circuit 34 for buffering the clock signal from the second timer 32 and supplying the buffered clock signal as the internal column address strobe signal. Preferably, the second predetermined period of the clock signal from the second timer 32 may be 40 ns. Also, the column address signal from the column address signal counter circuit 33 may be a 9-bit signal.

Upon receiving the test command signal from the test command signal generation stage 100, the second detector circuit 31 drives the second timer 32 in response to the internal row address strobe signal from the first buffer circuit 23 in the row address signal generation stage 200. As the second timer 32 is being driven, it supplies a clock train with a stable period to the second buffer circuit 34 and the column address signal counter circuit 33.

Preferably, the column address signal counter circuit 33 may be of the asynchronous type. The column address signal counter circuit 34 may also include bit counters of the same number (for example, 9) as that of bits of the column address signal.

The bit counters in the column address signal counter circuit 33 have the same structure as that of the bit counters in the row address signal counter circuit 24 and a description thereof will thus be omitted.

The bit counters in the column address signal counter circuit 33 then supply the column address signal bits through their output lines to a column address decoder (not shown).

The second buffer circuit 34 buffers the clock signal from the second timer 32 and supplies the buffered clock signal as the internal column address strobe signal.

The second timer 32 generates a predetermined number of clock signals for one period of the clock signal from the first timer 22 in the row address signal generation stage 200. The predetermined number of clock signals from the second timer 32 is a multiple (for example, 256) of the clock signal from the first timer 22. As a result, a predetermined number (for example, 256) of column address signals are toggled with respect to each row address signal to repeat data write and read operations.

Figure 2:
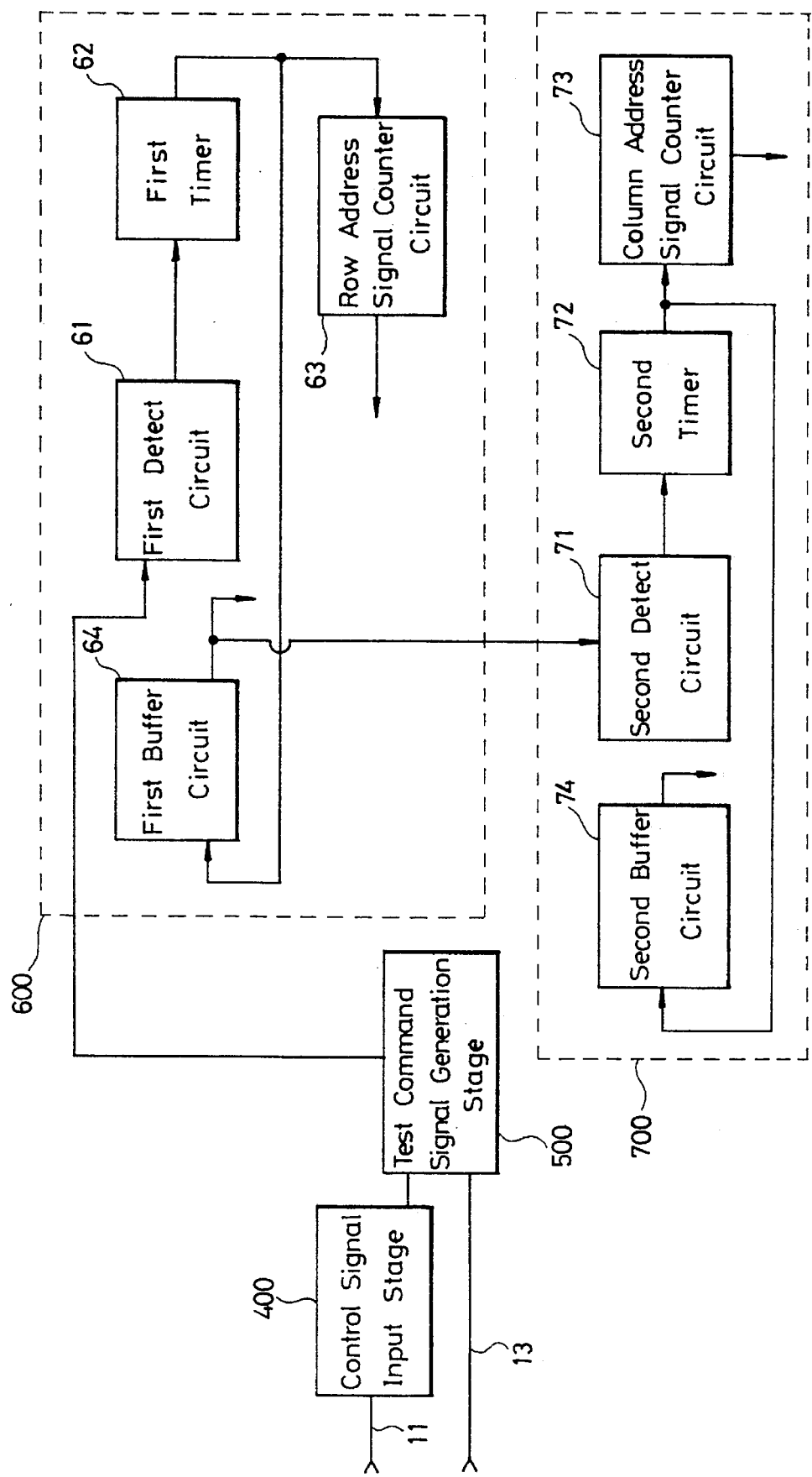
FIG. 2 is a block diagram of an automatic test circuit for a semiconductor memory device in accordance with an alternative embodiment of the present invention.

Referring to FIG. 2, there is shown a block diagram of an automatic test circuit for a semiconductor memory device in accordance with an alternative embodiment of the present invention. As shown in this drawing, the automatic test circuit comprises a control signal input stage 400 for receiving an external row address strobe signal after power applied to the semiconductor memory device is stabilized and generating a timing signal in response to the received external row address strobe signal, a test command signal generation stage 500 for generating a test command signal in response to a power stabilized signal from the memory device and an output signal from the control signal input stage 400, a row address signal generation stage 600 for generating an internal row address strobe signal and a row address signal in response to the test command signal from the test command signal generation stage 500, and a column address signal generation stage 700 for generating an internal column address strobe signal and a column address signal in response to the internal row address strobe signal from the row address signal generation stage 600.

Figure 3:
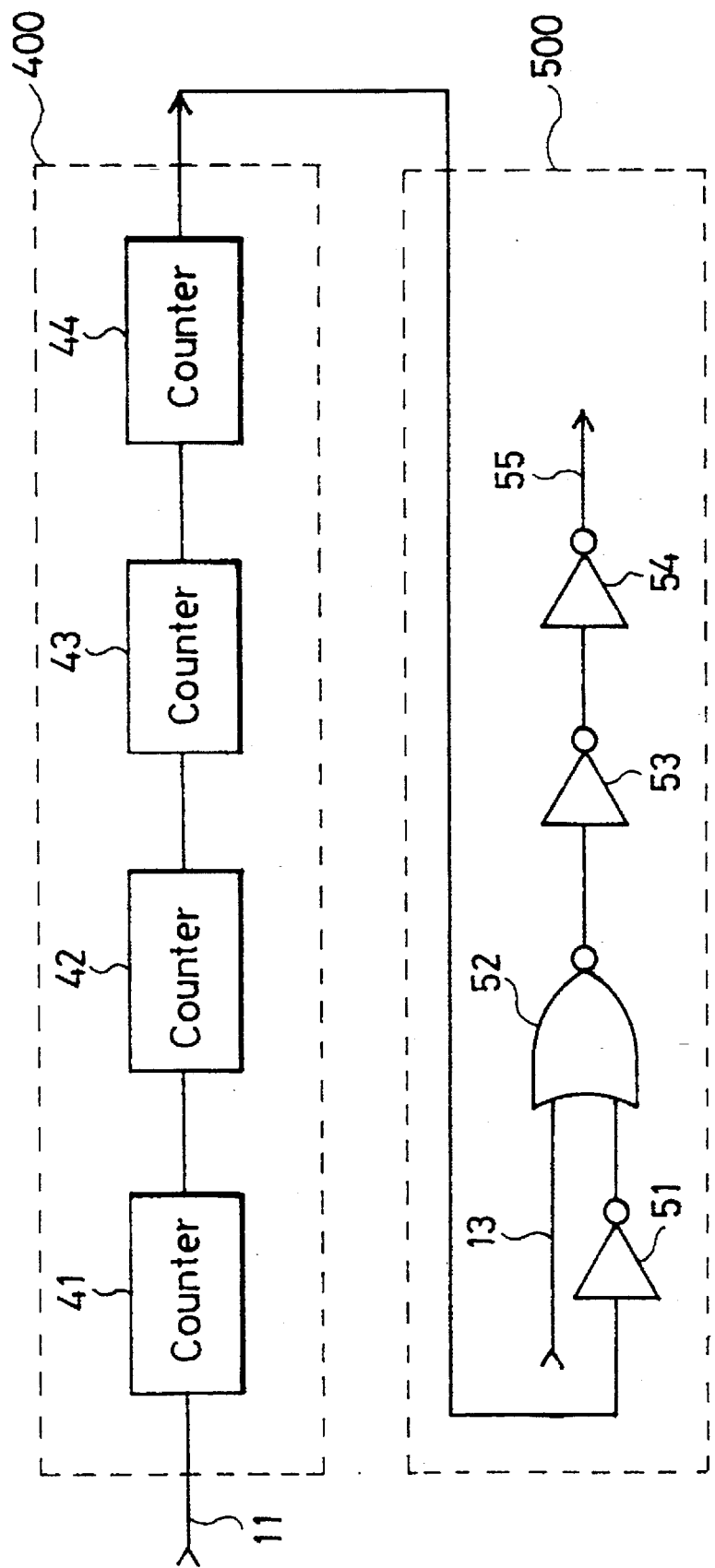
FIG. 3 is a partial circuit diagram of the automatic test circuit in FIG. 2.

Referring to FIG. 3, there is shown a partial circuit diagram of the automatic test circuit in FIG. 2. As shown in this drawing, the control signal input stage 400 includes a first bit counter 41 for receiving the external row address strobe signal as shown in FIG. 4B through an input line 11, a second bit counter 42 for receiving an output signal from the first bit counter 41, a third bit counter 43 for receiving an output signal from the second bit counter 42, and a fourth bit counter 44 for receiving an output signal from the third bit counter 43.

Figure 4A:
FIGS. 4A and 4E are waveform diagrams of input and output signals in FIG. 3.
Figure 4B:
Figure 4C:
Figure 4D:

The first bit counter 41 receives the external row address strobe signal as shown in FIG. 4B and outputs a signal as shown in FIG. 4C which has a period twice that of the received external row address strobe signal. The second bit counter 42 receives the output signal from the first bit counter 41 as shown in FIG. 4C and outputs a signal with a period twice that of the received signal. The fourth bit counter 44 receives the output signal from the third bit counter 43 and outputs a signal as shown in FIG. 4D which goes high in logic at the eight period of the external row address strobe signal as shown in FIG. 4B. Then, the fourth bit counter 44 supplies its output signal to the test command signal generation stage 500.

Figure 4E:

The test command signal generation stage 500 includes an inverter 51 for inverting the output signal as shown in FIG. 4D from the fourth bit counter 44 in the control signal input stage 400, a NOR gate 52 for receiving the power stabilized signal as shown in FIG. 4A from an input line 13 and an output signal from the inverter 51, and inverters 53 and 54 for delaying and buffering an output signal from the NOR gate 52 as shown in FIG. 4E and supplying the resultant test command signal to the row address signal generation stage 600.

Referring again to FIG. 2, the row address signal generation stage 600 includes a first detector circuit 61 for detecting the test command signal from the test command signal generation stage 500, a first timer 62 for generating a clock signal with a first predetermined period in response to an output signal from the first detector circuit 61, a row address signal counter circuit 63 for generating the row address signal in response to the clock signal from the first timer 62, and a first buffer circuit 64 for buffering the clock signal from the first timer 62 and supplying the buffered clock signal as the internal row address strobe signal to the column address signal generation stage 700. Preferably, the first predetermined period of the clock signal from the first timer 62 may be 16 μs. Also, the row address signal from the row address signal counter circuit 63 may be a 13-bit signal.

Upon receiving the test command signal from the test command signal generation stage 500, the first detector circuit 61 drives the first timer 62 to initialize a test mode. The first timer 62 generates the clock signal with the first predetermined period in response to the output signal from the first detector circuit 61. The first timer 62 then supplies the generated clock signal to the first buffer circuit 64 and the row address signal counter circuit 63.

Preferably, the row address signal counter circuit 63 may be of the asynchronous type. The row address signal counter circuit 63 may also include bit counters of the same number (for example, 13) as that of bits of the row address signal.

The bit counters may be of the conventional type and each of them has an output line connected to an input line of the subsequent bit counter. The first bit counter provides a bit output of a period (for example, 32 μs) twice that of the clock signal from the first timer 62. The second bit counter provides a bit output of a period (for example, 64 μs) twice that of the bit output from the first bit counter. In this manner, each of the bit counters outputs a signal of a period twice that of an output signal from the preceding bit counter. The bit counters then supply the row address signal bits through their output lines to a row address decoder (not shown).

The first buffer circuit 64 buffers the clock signal from the first timer 62 and supplies the buffered clock signal as the internal row address strobe signal to the column address signal generation stage 700.

The column address signal generation stage 700 includes a second detector circuit 71 for detecting the internal row address strobe signal from the first buffer circuit 64 in the row address signal generation stage 600, a second timer 72 for generating a clock signal with a second predetermined period in response to an output signal from the second detector circuit 71, a column address signal counter circuit 73 for generating the column address signal in response to the clock signal from the second timer 72, and a second buffer circuit 74 for buffering the clock signal from the second timer 72 and supplying the buffered clock signal as the internal column address strobe signal. Preferably, the second predetermined period of the clock signal from the second timer 72 may be 40 ns. Also, the column address signal from the column address signal counter circuit 73 may be a 9-bit signal.

Upon receiving the internal row address strobe signal from the first buffer circuit 64 in the row address signal generation stage 600, the second detector circuit 71 drived the second timer 72. As the second timer 72 is being driven, it feeds the clock signal to the second buffer circuit 74 and supplies it to the column address signal counter circuit 73. Preferably, the column address signal counter circuit 73 may be of the asynchronous type. The column address signal counter circuit 73 may also include bit counters of the same number (for example, 9) as that of bits of the column address signal. The bit counters in the column address signal counter circuit 73 have the same structure as that of the bit counters in the row address signal counter circuit 63 and a description thereof will thus be omitted. The bit counters in the column address signal counter circuit 73 then supply the column address signal bits through their output lines to a column address decoder (not shown).

The second buffer circuit 74 buffers the clock signal from the second timer 72 and supplies the buffered clock signal as the internal column address strobe signal.

The second timer 72 generates a predetermined number of clock signals for one period of the clock signal from the first timer 62 in the row address signal generation stage 600. The predetermined number of clock signals from the second timer 72 is a multiple (for example, 256) of the clock signal from the first timer 62. As a result, a predetermined number (for example, 256) of column address signals are toggled with respect to each row address signal to repeat data write and read operations.

As apparent from the above description, according to the present invention, the automatic test circuit is used in the semiconductor memory device to automatically test the semiconductor memory device in response to the internal row and column address strobe signals and the associated signals in the memory device. In the semiconductor memory device, the data read and write operations are performed in response to the test addresses from the automatic test circuit. Therefore, the present invention has the effect of enhancing the test speed and simplifying the layout of a system comprising the memory device.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An automatic test circuit for a semiconductor memory device comprising:

test command signal generation means for generating a test command signal in response to an external row address strobe signal, an external column address strobe signal, an external write signal and an external read signal;

row address signal generation means for generating an internal row address strobe signal and a row address signal in response to the external row address strobe signal and the test command signal from said test command signal generation means; and column address signal generation means for generating an internal column address strobe signal and a column address signal in response to the internal row address strobe signal from said row address signal generation means and the test command signal from said test command signal generation means.

2. An automatic test circuit for a semiconductor memory device as set forth in claim 1, wherein said row address signal generation means includes:

first detection means for detecting the test command signal from said test command signal generation means and the external row address strobe signal;

first clock generation means for generating a clock signal with a first predetermined period in response to an output signal from said first detection means;

first buffering means for buffering the external row address strobe signal and supplying the buffered external row address strobe signal to said first detection means, said first buffering means buffering the clock signal from said first clock generation means and supplying the buffered clock signal as the internal row address strobe signal to said column address signal generation means; and row address signal counter means for generating the row address signal in response to the clock signal from said first clock generation means; and wherein said column address signal generation means includes:

second detection means for detecting the test command signal from said test command signal generation means and the internal row address strobe signal from said first buffering means in said row address signal generation means;

second clock generation means for generating a clock signal with a second predetermined period in response to an output signal from said second detection means;

second buffering means for buffering the clock signal from said second clock generation means and supplying the buffered clock signal as the internal column address strobe signal; and column address signal counter means for generating the column address signal in response to the clock signal from said second clock generation means.

3. An automatic test circuit for a semiconductor memory device as set forth in claim 2, wherein said second predetermined period of said clock signal from said second clock generation means is shorter by a predetermined multiple than said first predetermined period of said clock signal from said first clock generation means.

4. An automatic test circuit for a semiconductor memory device as set forth in claim 2, wherein said first and second clock generation means include timers, respectively.

5. An automatic test circuit for a semiconductor memory device comprising:

control signal input means for receiving an external row address strobe signal after power applied to the semiconductor memory device is stabilized and generating a timing signal in response to the received external row address strobe signal;

test command signal generation means for generating a test command signal in response to an external memory device power stabilized signal and an output signal from said control signal input means;

row address signal generation means for generating an internal row address strobe signal and a row address signal in response to the test command signal from said test command signal generation means; and column address signal generation means for generating an internal column address strobe signal and a column address signal in response to the internal row address strobe signal from said row address signal generation means.

6. An automatic test circuit for a semiconductor memory device as set forth in claim 5, wherein said row address signal generation means includes:

first detection means for detecting the test command signal from said test command signal generation means;

first clock generation means for generating a clock signal with a first predetermined period in response to an output signal from said first detection means;

first buffering means for buffering the clock signal from said first clock generation means and supplying the buffered clock signal as the internal row address strobe signal to said column address signal generation means; and row address signal counter means for generating the row address signal in response to the clock signal from said first clock generation means; and wherein said column address signal generation means includes:

second detection means for detecting the internal row address strobe signal from said first buffering means in said row address signal generation means;

second clock generation means for generating a clock signal with a second predetermined period in response to an output signal from said second detection means;

second buffering means for buffering the clock signal from said second clock generation means and supplying the buffered clock signal as the internal column address strobe signal; and column address signal counter means for generating the column address signal in response to the clock signal from said second clock generation means.

7. An automatic test circuit for a semiconductor memory device as set forth in claim 5, wherein said control signal input means includes counting means for receiving the external row address strobe signal after the power applied to the semiconductor memory device is stabilized, counting the received external row address strobe signal for a predetermined time period and generating the timing signal in accordance with the counted result.

* * * * *